United States Patent
Chiu et al.

(10) Patent No.: US 10,520,303 B2
(45) Date of Patent: *Dec. 31, 2019

(54) METHOD FOR VALIDATING MEASUREMENT DATA

(71) Applicant: Taiwan Semiconductor Manufacturing Co., Ltd., Hsinchu (TW)

(72) Inventors: Chui-Jung Chiu, Zhubei (TW); Jen-Chieh Lo, New Taipei (TW); Ying-Chou Cheng, Zhubei (TW); Ru-Gun Liu, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 144 days.

This patent is subject to a terminal disclaimer.

(21) Appl. No.: 15/811,272

(22) Filed: Nov. 13, 2017

(65) Prior Publication Data
US 2018/0066939 A1 Mar. 8, 2018

Related U.S. Application Data

(63) Continuation of application No. 15/210,699, filed on Jul. 14, 2016, now Pat. No. 9,823,066, which is a
(Continued)

(51) Int. Cl.
*G01B 15/04* (2006.01)
*G01B 15/00* (2006.01)
*H01J 37/28* (2006.01)

(52) U.S. Cl.
CPC .......... *G01B 15/04* (2013.01); *G01B 15/00* (2013.01); *H01J 37/28* (2013.01); *G05B 2219/37127* (2013.01); *G05B 2219/37224* (2013.01)

(58) Field of Classification Search
CPC .......... G06T 2207/30141; G01R 31/26; G01R 31/2601; G01R 31/265; G01R 31/2653;
(Continued)

(56) References Cited

U.S. PATENT DOCUMENTS 5,511,005 A   4/1996  Abbe
6,185,472 B1* 2/2001  Onga .................. G06F 17/5018
                                                257/E21.525
(Continued)

FOREIGN PATENT DOCUMENTS

EP   1790989   5/2007
TW   396393    7/2000
(Continued)

OTHER PUBLICATIONS

Taiwan Office Action dated Jan. 5, 2015 in Patent Application No. 2013139705 filed Nov. 1, 2013.

*Primary Examiner* — Ronald D Hartman, Jr.
(74) *Attorney, Agent, or Firm* — Haynes and Boone, LLP

(57) ABSTRACT

A method includes receiving, into a measurement tool, a substrate having a material feature, wherein the material feature is formed on the substrate according to a design feature. The method further includes applying a source signal on the material feature, collecting a response signal from the material feature by using a detector in the measurement tool to obtain measurement data, and with a computer connected to the measurement tool, calculating a simulated response signal from the design feature. The method further includes, with the computer, in response to determining that a difference between the collected response signal and the simulated response signal exceeds a predetermined value, causing the measurement tool to re-measure the material feature.

20 Claims, 8 Drawing Sheets

Related U.S. Application Data continuation of application No. 13/666,140, filed on Nov. 1, 2012, now Pat. No. 9,404,743.

(58) Field of Classification Search
CPC .............. G01R 31/302; G01N 21/9501; G01B 2210/56; G01B 15/04; G01B 15/00; H01J 37/28; G05B 2219/37224; G05B 2219/37127
See application file for complete search history.

(56) References Cited

U.S. PATENT DOCUMENTS

| | | | |
|---|---|---|---|
| 6,249,891 | B1 | 6/2001 | Matsumura |
| 6,733,618 | B2 | 5/2004 | Kagoshima et al. |
| 6,788,074 | B2 | 9/2004 | Sarma |
| 6,791,679 | B2 | 9/2004 | Engelhard et al. |
| 6,881,352 | B2 | 4/2005 | Kagoshima et al. |
| 7,373,216 | B1* | 5/2008 | Winkler ........... G05B 19/41875 700/121 |
| 7,732,761 | B2 | 6/2010 | Tanaka et al. |
| 8,443,309 | B2 | 5/2013 | Abdo |
| 8,595,657 | B2 | 11/2013 | Cha et al. |
| 8,670,115 | B2 | 3/2014 | Miyoshi |
| 2001/0007972 | A1 | 7/2001 | Araki |
| 2003/0234655 | A1 | 12/2003 | Sarma |
| 2006/0085682 | A1 | 4/2006 | Tada |
| 2006/0124243 | A1 | 6/2006 | Kagoshima et al. |
| 2007/0229807 | A1* | 10/2007 | Lally ................. G01N 21/9501 356/237.1 |
| 2007/0232045 | A1* | 10/2007 | Lally ................. H01L 21/76807 438/597 |
| 2008/0027565 | A1* | 1/2008 | Erva ..................... G01B 11/24 700/1 |
| 2008/0076046 | A1* | 3/2008 | Willis ................ G01N 21/4788 430/30 |
| 2008/0077362 | A1* | 3/2008 | Willis ................ G03F 7/70516 702/189 |
| 2008/0091724 | A1* | 4/2008 | Qiu ..................... G01B 11/24 |
| 2008/0243295 | A1* | 10/2008 | Winkler ............ G05B 23/0264 700/121 |
| 2008/0285054 | A1 | 11/2008 | Vuong et al. |
| 2008/0298669 | A1 | 12/2008 | Funakoshi |
| 2009/0182448 | A1 | 7/2009 | Mansfield |
| 2009/0240364 | A1 | 9/2009 | Lucas et al. |
| 2010/0166289 | A1 | 7/2010 | Satake et al. |
| 2010/0229147 | A1 | 9/2010 | Ye et al. |
| 2010/0251202 | A1 | 9/2010 | Pierrat |
| 2011/0127429 | A1 | 6/2011 | Miyamoto et al. |
| 2011/0189595 | A1* | 8/2011 | Tanabe ................... C03C 19/00 430/5 |
| 2011/0255080 | A1 | 10/2011 | Miyoshi |
| 2012/0227017 | A1 | 9/2012 | Abdo |
| 2012/0229786 | A1 | 9/2012 | Engelen |
| 2014/0121799 | A1* | 5/2014 | Liu ....................... G01B 15/00 700/97 |
| 2016/0320183 | A1 | 11/2016 | Chiu et al. |

FOREIGN PATENT DOCUMENTS

| | | |
|---|---|---|
| TW | 200304079 | 9/2003 |
| TW | 201113931 | 4/2011 |
| WO | WO2012014356 | 2/2012 |

* cited by examiner

METHOD FOR VALIDATING MEASUREMENT DATA

PRIORITY INFORMATION

This application is a continuation of U.S. patent application Ser. No. 15/210,699 filed Jul. 14, 2016 and entitled "Method for Validating Measurement Data," which is a continuation of U.S. patent application Ser. No. 13/666,140 filed Nov. 1, 2012 and entitled "Method of Validating Measurement Data," the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

The scaling down of an IC device also faces challenges for performing a measurement on a complicated topography surface of a semiconductor wafer. For example, the complicated topography and the scaled down feature may cause a measurement error on a measurement tool, such as a scanning electron microscope (SEM) tool. Significant labor and time are therefore frequently needed to verify the measurement. Accordingly, what is needed is a method for verifying measurement data more efficiently and accurately

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
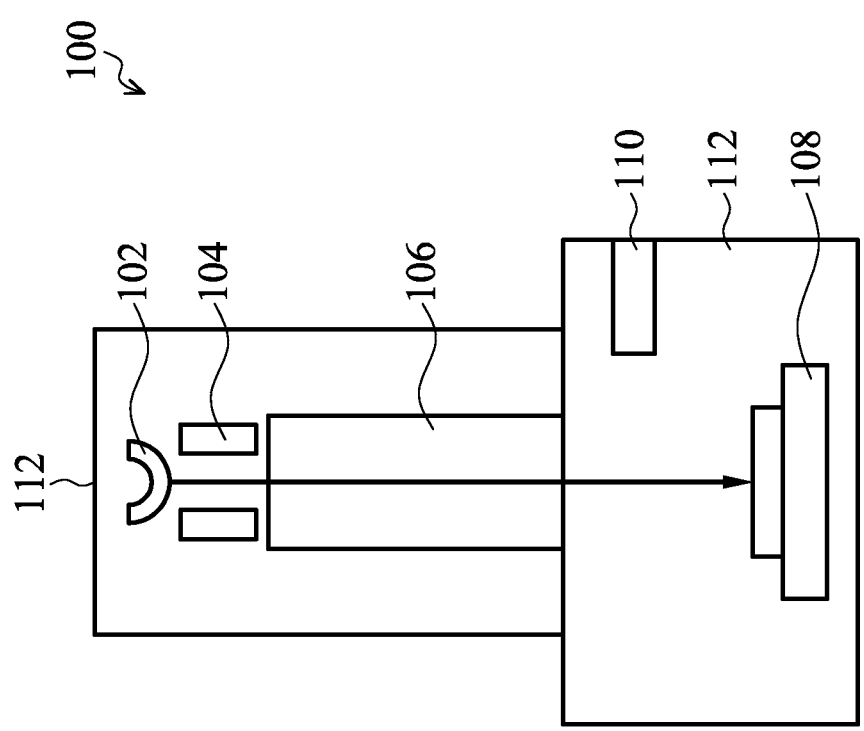
FIG. 1 is a diagram of a scanning electron microscope (SEM) tool that can be used with one or more embodiments of the present invention.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, an example diagram of a SEM system 100 is illustrated for use with one or more embodiments of the present invention. In the present example, the SEM system 100 may also be referred to as a CDSEM or a CD-SEM system, with CD standing for critical dimension. Also, it is understood that different types of measurement systems may also be used with one or more embodiments of the present invention. Continuing with the present example, the SEM system 100 includes an electron source 102, an anode 104, an electro-optical column 106, a stage 108, a detector 110, and a vacuum chamber 112. However, other configurations and inclusion or omission of the system may be possible.

The electron source 102 provides an electron beam emitted from a conducting material by heating the conducting material connected to a cathode to a very high temperature, where the electrons have sufficient energy to overcome a work function barrier and escape from the conducting material (thermionic sources), or by applying an electric field sufficiently strong that the electrons tunnel through the work function barrier (field emission sources). An anode/cathode 104 combined with the cathode provides an electric field to accelerate the electron beam emitted from the electrons source 102. The electro-optical column 106 includes a plurality of electromagnetic apertures, electrostatic lenses, electromagnetic lenses, shaping deflectors and cell selection deflectors. The electro-optical column 106 is configured to focus and project the electron beam to a sample or substrate. The stage 108 includes motors, roller guides, and tables. The stage 108 is configured to secure a sample or substrate on the stage 108 by vacuum and provides the accurate position and movement of the sample or the substrate in X, Y and Z directions during focus, leveling, and measurement operation. The vacuum chamber 112 is configured to connect to a plurality of pumps, such as mechanical pumps and ion pumps, and provides a high vacuum environment for the SEM system 100.

The detector 110 includes a secondary electron detector, an X-ray detector, and/or a backscatter electron detector. Different detectors are configured for different purposes. For example, a secondary electron detector detects a signal from interaction between the electron beam projected on a sample and atoms at or near the surface of the sample. As a result, the secondary electron detector provides a high resolution image of surface of the sample. In the present embodiments, the secondary electron detector is also used to measure a dimension of the sample. In another example, an X-ray detector detects a signal when the electron beam projected on the sample removes an inner shell electron from the sample and a higher electron to fill the shell and releases energy. The X-ray detector detects the composition and abundance of elements in the sample.

Figure 2:
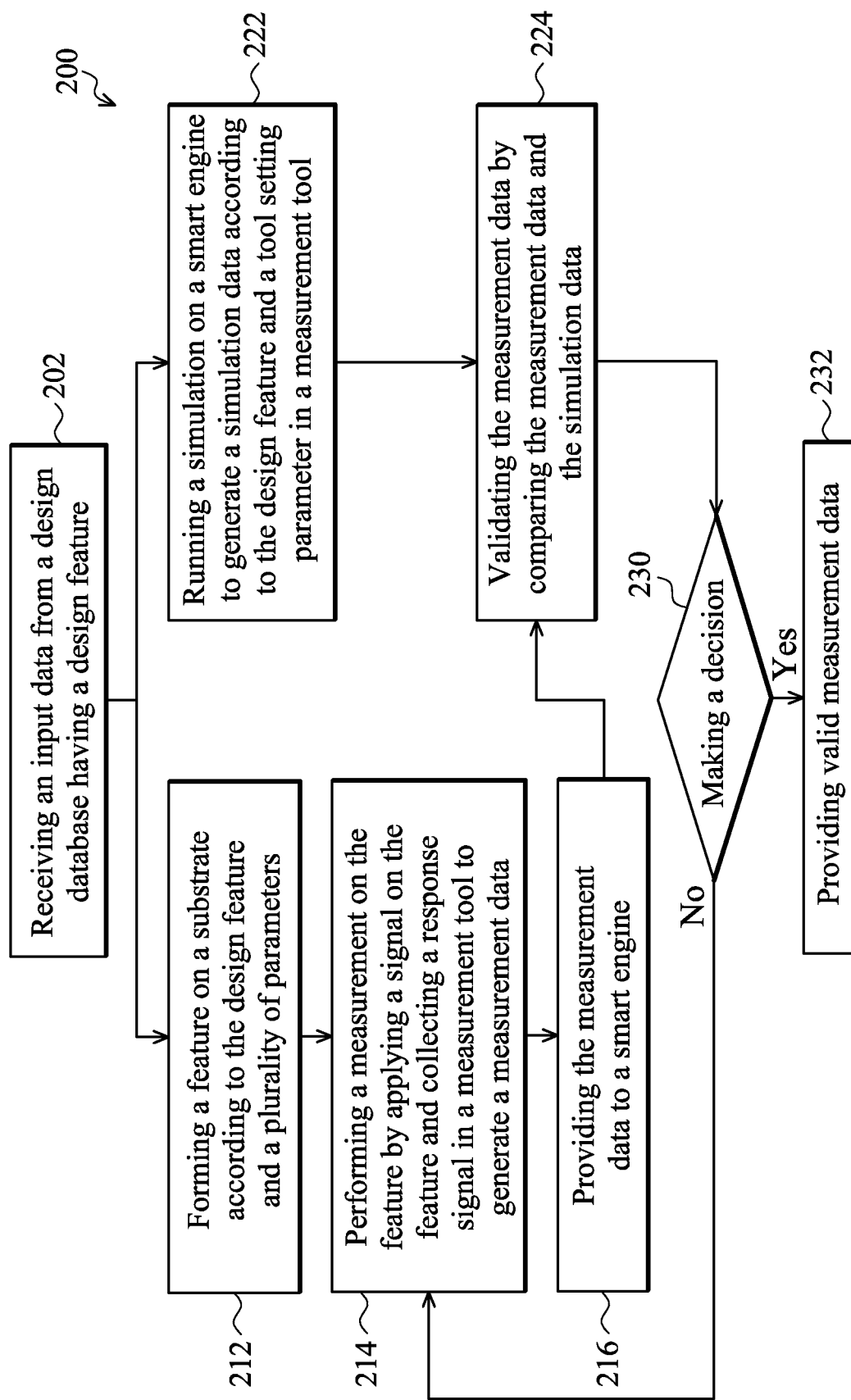
FIG. 2 is a flow chart of an exemplary method of validating measurement data, such as data obtained from the SEM tool of FIG. 1.

Referring to FIG. 2, a flow chart of a method 200 for validating a measurement, such as would be obtained from the SEM system 100 of FIG. 1, is provided. The method 200 begins at step 202 by receiving an integrated circuit (IC) design for a device to be measured. The design may be received, for example, from an IC design house. The IC design house may be in independent design house or a design house belonging to a semiconductor fab. In the present embodiments, an IC design is also referred to as design data or IC design data. Continuing with the present example, the IC design data includes a design feature which corresponds to a feature on a device manufactured (at least partially) in a semiconductor fab. For example, the design feature may include a film with a thickness deposited on a wafer substrate. In another example, the design feature includes a resist pattern with a dimension formed on a substrate.

As shown in the figure, the method 200 includes parallel paths of method steps. It is understood that a specific sequence of the steps, including whether any two steps are done in parallel, is not required, except as explicitly identified below.

The method 200 proceeds to step 212 by forming a material feature on a substrate according to the design feature in the IC design data. For the sake of example, the material feature includes a photoresist film deposited on a semiconductor wafer. Step 212 may also include forming a resist pattern on the wafer.

The wafer may be in various stages of fabrication, and may include various doped features, isolation features, and device features, such as gate structures. In addition, the wafer may include additional films, such as one or more metal layers and/or dielectric layers. The films may be formed by various techniques, including chemical vapor deposition (CVD), a physical vapor deposition (PVD), an atomic level deposition (ALD), an electric-plating process or a spin-on process.

Figure 3A:
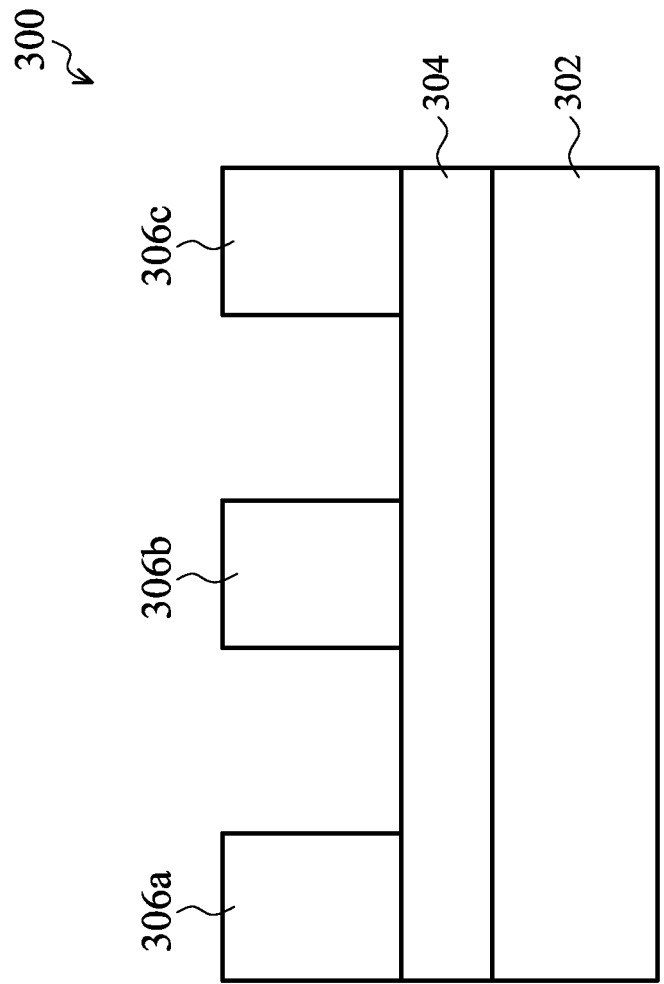
FIGS. 3A-B are examples of measurements according to one or more embodiments.

Referring also FIG. 3A, in the present example, a film 304 is disposed on the substrate 302, and a patterned resist layer 306 is formed on the film 304.

The method 200 proceeds to step 214 by performing a measurement on a material feature formed on a substrate using a measurement tool to generate a measurement data of the feature. Step 214 includes measuring dimension of a feature, such as a width. In some embodiments, step 214 further includes taking an image of the feature to be measured. In the present example, a dimension of a resist pattern may include the width of a resist line or a space between two resist lines.

Figure 3B:
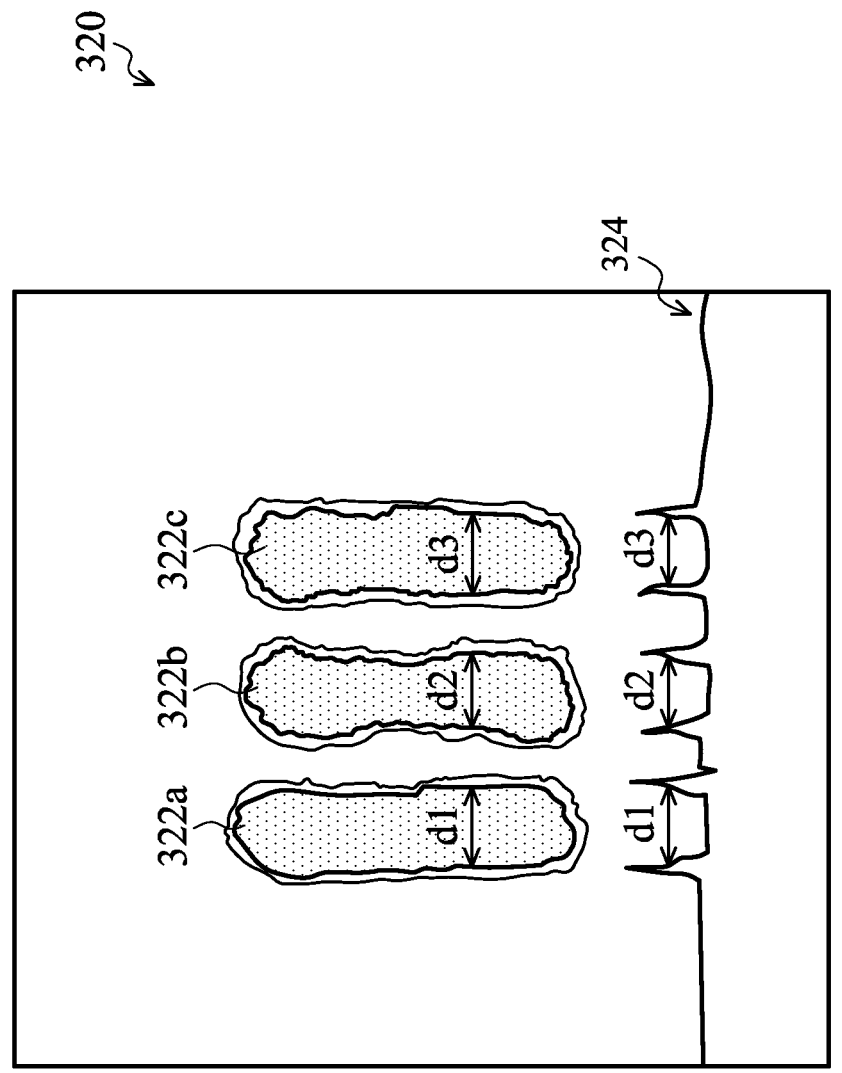

In the present embodiments, a dimension of a material feature is measured on a measurement or a metrology tool, such as the SEM system 100 of FIG. 1 using a secondary electron detector. Referring to the example of FIG. 3B, top view SEM images 322a-c of the resist pattern 306a-c respectively, a secondary electron signal line profile 324 by scanning the resist patterns 306a-c on top using an electron beam, and dimensions d1-d3 for the resist patterns 306a-c are illustrated. The dimensions d1-d3 for the resist patterns 306a-c are obtained by using a distance between two related peeks of the secondary electron signal line profile 324 at a threshold, for example, 70%.

A top view SEM image and secondary electron signal line profile of a material feature are obtained by scanning the material feature on top using an electron beam and collecting an emitted secondary electrons using a secondary electron detector with reference to FIG. 1. Because a semiconductor substrate includes non-conductive material and a complicated topology, a secondary electron signal line profile may appear somewhat noise, and a dimension provided by the secondary electron signal line profile may be not accurate, and even worse a wrong peak is chosen due to a high noise. The SEM measurement data needs to be checked and validated. In a traditional method, the validation of the SEM measurement data is performed by a human. For example, after the SEM measurement is taken, a skilled operator, technician, or engineer needs to review a plurality of SEM images and secondary electron signal line profiles using his or her eyes. The reviewing is a time-intensive endeavor, such as collecting the SEM data for building an optical proximity correction (OPC) database or for calibrating an exposing tool in a semiconductor fab.

Referring again to FIG. 2, after SEM measurement, the method 200 proceeds to step 216 by providing the SEM measurement data to a smart review engine. The SEM measurement data includes SEM images and secondary electron signal line profiles. The smart engine will be discussed in more detail below.

As discussed above, the method 200 includes multiple steps that can be done in various sequences, including some that can be done in parallel. At step 222, a simulation is performed on the smart engine to generate a simulated measurement data. The simulation not only analyzes the design feature, but also receives measurement parameters. In the present embodiments, a simulated measurement data is also referred to as simulated data or a simulated result. A design feature may include a film to be deposited on a substrate, or a pattern or feature to be formed in a substrate. A design feature also includes thickness of the film and dimension of the pattern or feature. A simulated data or result includes thickness of a film, a profile of a pattern or a dimension of a pattern. The measurement parameters include measurement locations used to measure a feature, measurement magnification, and measurement area. In one embodiment, running a simulation includes generating a simulated or synthetic secondary electron signal profile or waveform using a design feature and SEM tool parameters, such as measurement locations, measurement magnification, and measurement area.

Figure 4A:
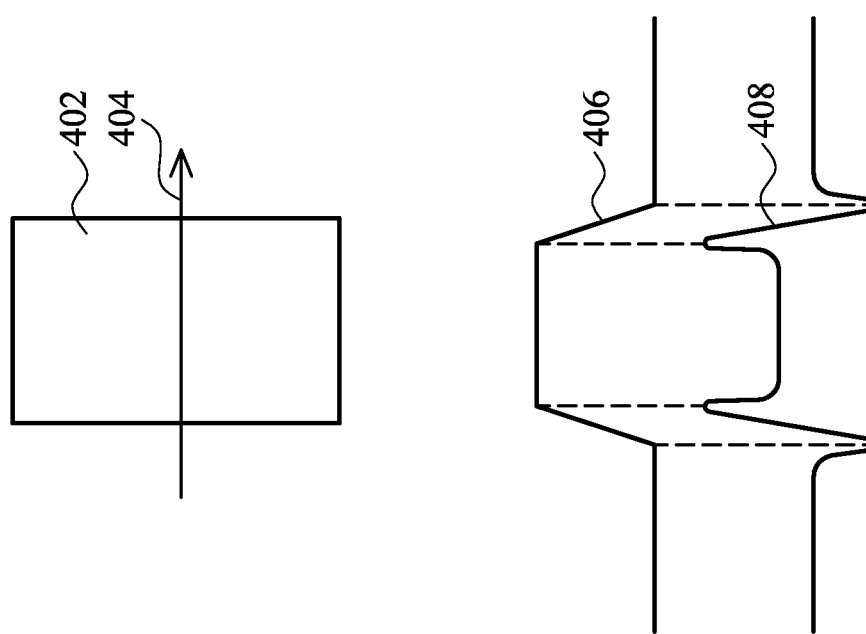
FIGS. 4A-C are examples of validating measurement data according to one or more embodiments.

Referring to FIG. 4A, in the present example, a design feature 402 for a resist pattern, is a simulated along a scanning electron beam 404. This results in a simulated resist pattern profile 406 for the resist pattern, and a simulated secondary electron signal profile 408 of the resist pattern.

In some embodiments, running a simulation on a smart engine includes generating a simulated secondary electron signal profile for a distance between two design features using a simulated scanning electron beam. Using a simulated scanning electron beam may include scanning multiple times by a simulated scanning electron beam to improve a signal to noise ratio for better measurement.

Figure 4B:
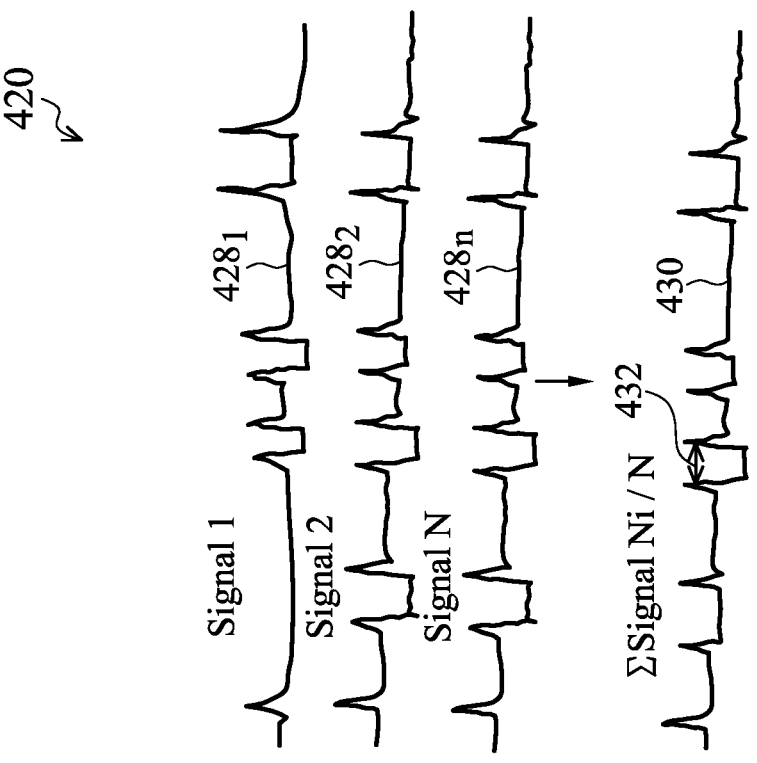
Figure 4B:
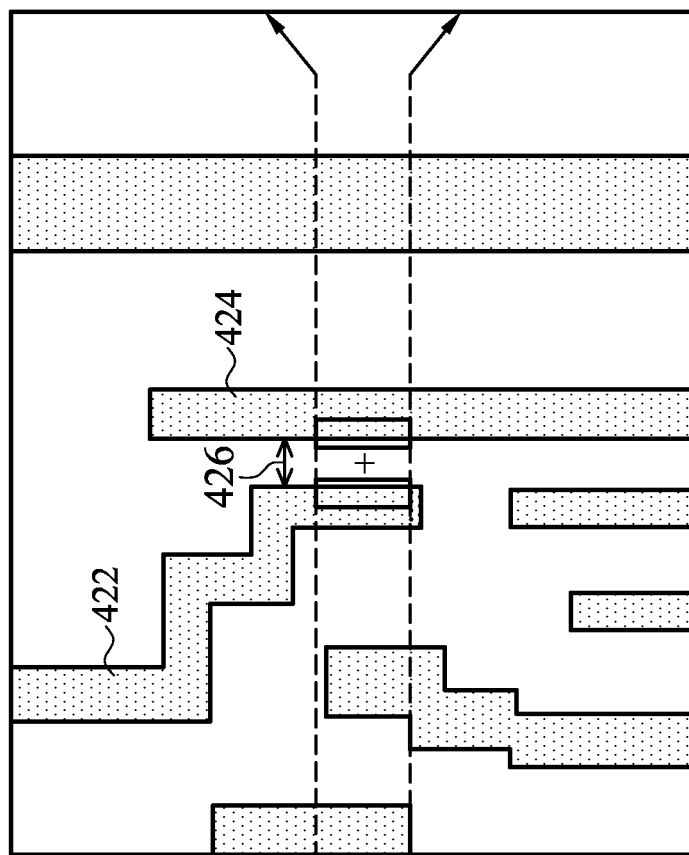

Referring to FIG. 4B, in the present example, a first design feature 422, a second design feature 424, a design distance 426 between the first design feature 422 and the second design feature 424, a first simulated secondary electron signal profile $428_1$, a second simulated secondary electron signal profile $428_2$, an nth simulated secondary electron signal profile $428_n$, a summed simulated secondary electron signal profile 430, and a calculated distance 432 on a substrate for the design distance 426 are illustrated.

Referring again to FIG. 2, the method 200 proceeds to step 224 by validating a measurement data. Step 224 includes reviewing a measured data and a simulated measurement data on a smart engine. Step 224 also includes comparing the measured data and a simulated measurement data on the smart engine. In the present embodiments, step 224 includes comparing a collected secondary electron signal profile obtained from performing a measurement on a SEM tool with a simulated secondary electron signal profile obtained on the smart engine using a SEM tool setting or measurement parameters. Step 224 further includes comparing a profile difference between the collected secondary electron signal profile and the simulated secondary electron signal profile. Step 224 also includes comparing a dimension difference between a measurable dimension from the collected secondary electron signal profile and a simulated dimension from the simulated secondary electron signal profile.

Figure 4C:
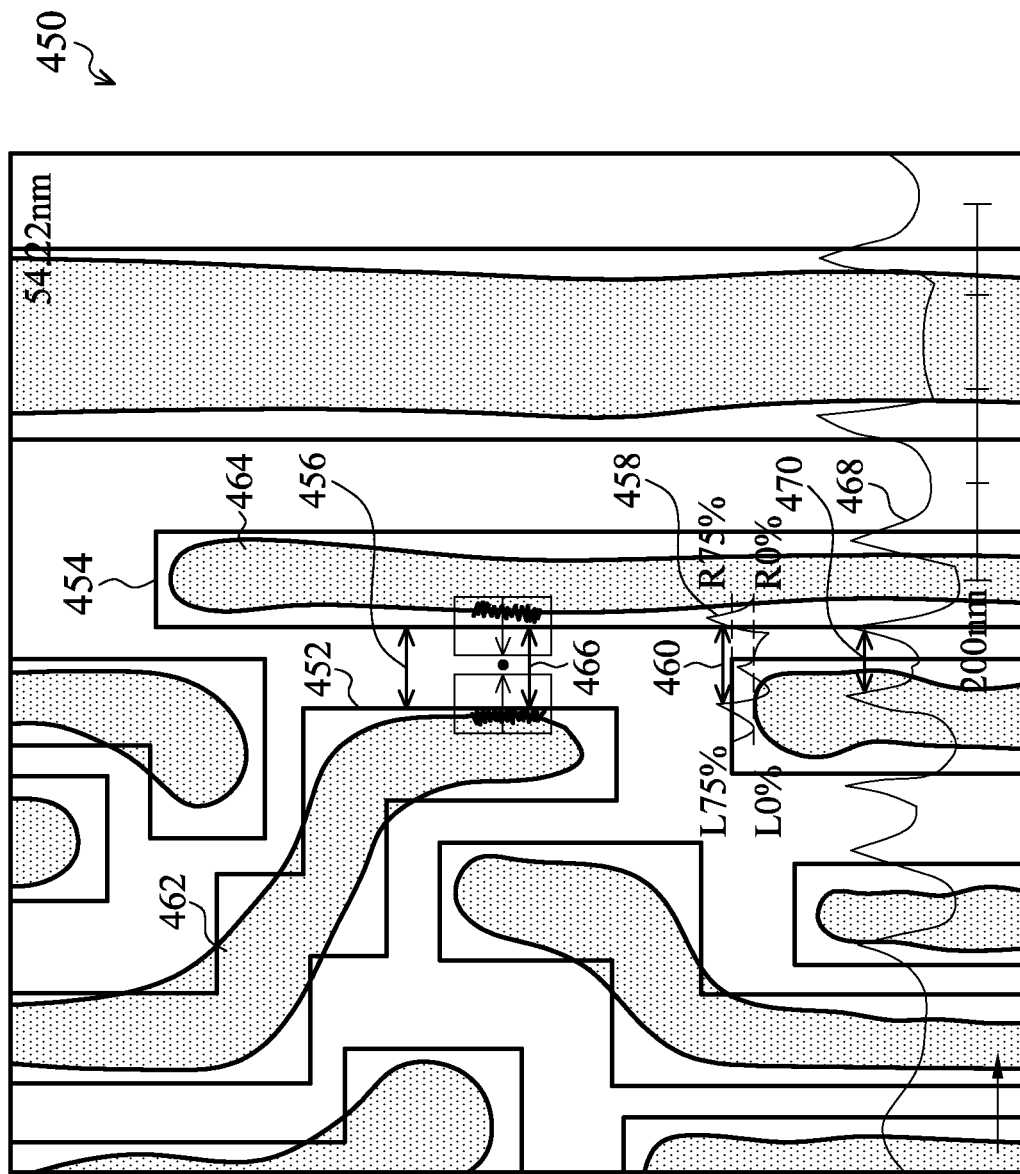

Referring to FIG. 4C, in the present example, a first design feature 452, a second design feature 454, a design distance 456 between the first design feature 452 and the second design feature 454, a first trench pattern 462, a second trench pattern 464, a space 466 between the first trench pattern 462 and the second trench pattern 464, and a collected secondary electron signal profile 468 are illustrated. In the embodiment, step 224 includes comparing the simulated secondary electron signal profile 430 with the collected secondary electron signal profile 468.

Referring again to FIG. 2, the method 200 proceeds to step 230 by making a decision. In the present embodiments, step 230 includes evaluating a difference between a simulated secondary electron signal profile and a collected secondary electron signal profile in a SEM measurement. For example, if the collected secondary electron signal profile from a feature formed on a substrate fits the simulated secondary electron signal profile, a SEM measurement of the feature is considered a valid SEM measurement and a measurement value of a dimension is valid. In another example, if the collected secondary electron signal profile from a feature formed on a substrate does not fit the simulated secondary electron signal profile, a SEM measurement is considered an invalid SEM measurement and the feature will be re-measured on a SEM tool again.

The method 200 proceeds to step 232 by finishing the measurement and providing valid measurement data for further processing. In the present embodiment, step 232 may include providing valid SEM measurement data for one or more subsequent processes, such as etching or implant process. Step 232 may include providing valid SEM measurement data for an OPC modeling or for calibrating a tool. Additional steps can be provided before, during, and after the method 200, and some the steps described can be replaced, eliminated, or moved around for additional embodiments of the method 200. The method 200 is example embodiments, and is not intended to limit the present invention beyond what is explicitly recited in the claims.

Figure 5:
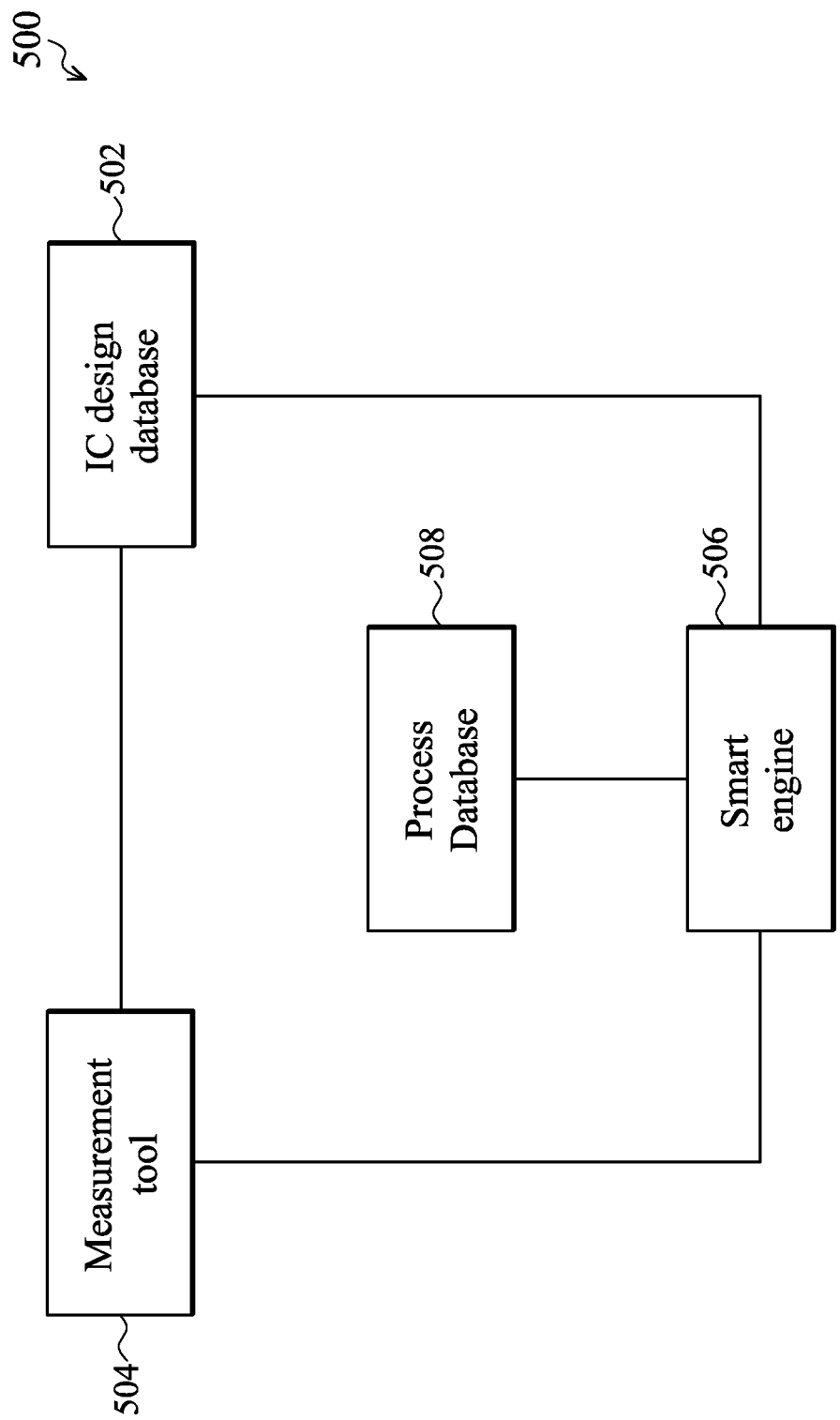
FIG. 5 is a system for validating measurement data according to one or more embodiments of the present invention.

Referring to FIG. 5, an example of a system 500 for validating measurement data using the method 200 is illustrated. The system 500 includes an IC design database 502, a measurement tool 504, smart engine 506, and a process database 508. However, other configurations and inclusion or omission of the system 500 may be possible. The system 500 is drawn as an example, and is not intended to limit the present invention beyond what is explicitly recited in the claims.

The IC design database 502 is configured to connect to the measurement tool 504 and the smart engine 504. The IC design database 502 includes various geometrical patterns or features designed for an IC product and based on the specification of the IC product. The various geometrical patterns or features form electronic components, such as transistors, resistors, capacitors and the metallic interconnect of these components onto a piece of semiconductor, typical silicon. The IC design database may include certain assist features, such as features often used for imaging effect, process enhancement, process monitor, and/or mask identification information. The IC design database 502 provides a pattern or a feature to the measurement tool 504 to create a measurement recipe on the measurement tool 504. The IC design database 502 also provides a pattern or a feature to the smart engine 506 for performing a simulation on the smart engine 506.

The measurement tool 504 is configured to communicate with the IC designed database 502 and the smart engine 506. The measurement tool 504 includes a source applying a source signal on a sample and a detector collecting a response signal from the sample so that the sample is measured and a measurement data is obtained from the detector. In the present embodiments, the measurement tool 504 includes performing a measurement on a feature formed on a semiconductor substrate, such as measuring a dimension of a feature using a SEM system, such as the system 100 of FIG. 1. The measurement tool 504 provides measured data and secondary electron signal waveform to the smart engine 506 for the smart engine 506 comparing the measured secondary electron signal waveform with a simulated one for adjusting to validate the measured data or not.

The process database 508 includes information relating to one or more processes in the manufacturing facility. For example, the process database 508 may include process control limits and parameters for controlling resolution limits for a lithography system. The process database 508 may further include information from the smart engine 506, the measuring tool 504, or from another source (e.g., a process engineer), showing common measurement characteristics for a specific process and/or tool. For example, if a tool is known for a certain characteristic (e.g., producing slightly bigger CD than targeted, but within processing parameters), this characteristic may be included in the process database 508.

The smart engine 506 includes a standard, general-purpose computer including a processor, memory, and interface. The smart engine 506 is configured to interface with the process database 508, the IC design database 502 and the measurement tool 504. The computer may be a single computer or a distributed computer, and connects to various components of the IC design database 502, the process database 508, and the measurement tool 504 including but not limited to the connections shown in FIG. 5. The smart engine 506 includes one or more software programs for performing a simulation and making decisions in one or more steps of the method 200. The smart engine software performs the simulation using a set of input data including a feature from IC design database, measurement tool settings and measurement parameters to generate a simulated data of a measurement. The smart engine 506 also includes performing a comparison between a measured data and a simulated data and calculating a difference between the measured data and the simulated data. The smart engine 506 further includes making a decision to validate the measured data if the difference is smaller than a predetermined value or re-measure the feature formed on the substrate if the difference is larger than a predetermined value.

In one embodiment, a resist pattern is formed on a substrate according to a design layout, a dimension of the resist pattern is measured on a SEM tool using a collected secondary electron signal profile, a simulated secondary electron signal profile is generated on a smart engine according to a design layout using SEM tool settings and measurement parameters, a difference between the collected secondary electron signal profile and the simulated secondary signal profile is calculated on the smart engine, and the measured dimension is validated by the smart engine if the difference is smaller than a predetermined value or within a specification in a fab; and otherwise, the measured dimension is invalidated by the smart engine if the difference is larger than a predetermined value or out of a specification in a fab.

Thus, the present disclosure describes a method of validating a measurement data. The method includes receiving a substrate having a material feature, where in the material feature is formed on the substrate according to a design feature, applying a source signal on the material feature by using a source in a measurement tool having a tool setting parameter, collecting a response signal from the material feature by using a detector in the measurement tool to obtain the measurement data, calculating a simulated response signal from the design feature by a smart engine using the tool setting parameter, and validating the measurement data by comparing the collected response signal with the simulated response signal. Applying a source signal includes applying an optical, electronic, mechanical signal, or combination thereof. Collecting a response signal includes collecting a responded optical, electronic, mechanical signal, or combination thereof. Collecting a response signal further includes collecting a secondary electron signal on a scanning electron microscope (SEM) tool. Calculating the simulated response signal includes calculating a simulated response optical, electronic, mechanical signal, or combination thereof. Calculating the simulated response signal further includes calculating a simulated secondary electron signal. Validating the measurement data includes calculating a difference between the collected response signal and the simulated response signal. Validating the measurement data further includes evaluating the difference. Validating the measurement data further includes passing the measurement if the difference is smaller than a predetermined value. Validating the measurement data further includes performing a re-measurement if the difference is larger than a predetermined value.

In one or more embodiments, a method of validating a measurement data is described. The method includes receiving a design data having design feature, wherein a material feature is formed on a substrate according to the design feature, performing a measurement on the material feature by applying an electron beam on the material feature and collecting a secondary electron signal from the material feature using a scanning electron microscope (SEM) tool having a tool setting parameter, executing a simulation on a smart engine using the design feature and the tool setting parameter to generate a simulated secondary electron signal, and validating the measurement by comparing the collected secondary electron signal and the simulated secondary electron signal. Validating the measurement includes calculating a difference between the collected secondary electron signal and the simulated secondary electron signal. Validating the measurement further includes evaluating the difference. Validating the measurement further includes passing the measurement if the difference is smaller than a predetermined value. Validating the measurement further includes performing a re-measurement if the difference is larger than a predetermined value.

In some embodiments, a system for validating a measurement data is described. The system includes a design database having a design feature, where a material feature is formed on a substrate according to the design feature, a measurement tool configured to connect the design database, wherein the measurement tool having a tool setting parameter includes a source generating a source signal applied on the material feature and a detector collecting a response signal from the material feature so that a measurement of the material feature is performed on the measurement tool, and a smart review engine configured to connect the measurement tool and the design database, wherein the smart engine generates a simulated response signal using the design feature and the tool setting parameter so that the measurement is validated by comparing the response signal and the simulated response signal. The source signal includes an optical, mechanical, electronic signal, or combination thereof. The response signal includes an optical, mechanical, electronic signal, or combination thereof. The simulated response signal includes a simulated response optical, mechanical, electronic signal, or combination thereof. The simulated response signal further includes a simulated secondary electron signal profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving, into a measurement tool, a substrate having a material feature, wherein the material feature is formed on the substrate according to a design feature;
   applying a source signal on the material feature;
   collecting a response signal from the material feature by using a detector in the measurement tool to obtain measurement data;
   with a computer connected to the measurement tool, calculating a simulated response signal from the design feature; and
   with the computer, in response to determining that a difference between the collected response signal and the simulated response signal exceeds a predetermined value, causing the measurement tool to re-measure the material feature.

2. The method of claim 1, wherein applying the source signal is done by using a source in the measurement tool having a tool setting parameter.

3. The method of claim 2, wherein calculating the simulated response signal comprises using the tool setting parameter.

4. The method of claim 3, wherein collecting the response signal comprises collecting a secondary electron signal with a scanning electron microscope (SEM) tool.

5. The method of claim 1, wherein calculating the simulated response signal includes calculating a simulated response optical, electronic, or mechanical signal.

6. The method of claim 5, wherein calculating the simulated response signal comprises calculating a simulated secondary electron signal.

7. The method of claim 1, wherein comparing the collected response signal to the simulated response signal includes calculating the difference between the collected response signal and the simulated response signal.

8. The method of claim 7, further comprising evaluating the difference to determine if it is within the predetermined value.

9. The method of claim 8, further comprising presenting the measurement as a good measurement if the difference is smaller than the predetermined value.

10. The method of claim 1, wherein the simulated response signal comprises a summed simulated response signal.

11. A method comprising:
 with a computer connected to a measurement tool, receiving a design data having design feature, wherein a material feature is formed on a substrate according to the design feature;
 with the measurement tool, performing a measurement on the material feature by applying an electron beam on the material feature and collecting a secondary electron signal from the material feature using a scanning electron microscope (SEM) tool;
 with the computer, executing a simulation using the design feature to generate a simulated secondary electron signal; and
 in response to determining that a difference between the collected secondary electron signal and the simulated secondary electron signal exceeds a predetermined value, re-measuring the material feature with the measurement tool.

12. The method of claim 11, further comprising calculating a difference between the collected secondary electron signal and the simulated secondary electron signal.

13. The method of claim 12, further comprising comparing the difference to the predetermined value.

14. The method of claim 13, wherein further comparing passing the measurement if the difference is smaller than the predetermined value.

15. The method of claim 11, wherein executing the simulation comprises multiple scans with a simulated scanning electron beam.

16. A system comprising:
 a design database;
 a measurement tool connected to the design database, the measurement tool configured to:
  with a source, generate a source signal on a material feature; and
  with a detector, collect a response signal from the material feature to obtain a measurement of the material feature; and
 a computer connected to the measurement tool and the design database, wherein the computer is configured to:
  generate a simulated response signal; and
  cause the measurement tool to re-measure the material feature in response to determining that a difference between the response signal and the simulated response signal exceeds a predetermined value.

17. The system of claim 16, wherein:
 the design database comprises a design feature associated with the material feature; and
 to generate the simulated response signal, the computer uses the design feature.

18. The system of claim 16, wherein the source signal and the response signal include an optical, mechanical, electronic signal, or combination thereof.

19. The system of claim 18, wherein the simulated response signal includes a simulated response optical, mechanical, electronic signal, or combination thereof.

20. The system of claim 19, wherein the simulated response signal comprises a simulated secondary electron signal profile.

* * * * *